(12) United States Patent
Hsu et al.

(10) Patent No.: US 12,009,054 B2
(45) Date of Patent: Jun. 11, 2024

(54) COMPUTING-IN-MEMORY CIRCUITRY

(71) Applicant: National Taiwan University, Taipei (TW)

(72) Inventors: Ying-Tuan Hsu, Taipei (TW); Tsung-Te Liu, Taipei (TW); Tzi-Dar Chiueh, Taipei (TW)

(73) Assignee: National Taiwan University, Taipei (TW)

( * ) Notice: Subject to any disclaimer, the term of this patent is extended or adjusted under 35 U.S.C. 154(b) by 178 days.

(21) Appl. No.: 17/883,630

(22) Filed: Aug. 9, 2022

(65) Prior Publication Data

US 2024/0055033 A1  Feb. 15, 2024

(51) Int. Cl.
*G11C 11/00* (2006.01)
*G11C 7/12* (2006.01)
*G11C 7/16* (2006.01)
*G11C 7/22* (2006.01)
*G11C 8/08* (2006.01)

(52) U.S. Cl.
CPC ............ *G11C 7/16* (2013.01); *G11C 7/12* (2013.01); *G11C 7/22* (2013.01); *G11C 8/08* (2013.01)

(58) Field of Classification Search
CPC .... G11C 7/16; G11C 7/12; G11C 7/22; G11C 8/08
See application file for complete search history.

(56) References Cited

U.S. PATENT DOCUMENTS

| | | | |
|---|---|---|---|
| 11,263,522 B2 | 3/2022 | Nestler et al. | |
| 2021/0241820 A1 | 8/2021 | Biswas et al. | |
| 2021/0271597 A1 | 9/2021 | Verma et al. | |
| 2021/0349689 A1* | 11/2021 | Lu | G11C 5/02 |
| 2022/0012586 A1* | 1/2022 | Lin | G06N 5/04 |

(Continued)

FOREIGN PATENT DOCUMENTS

| | | |
|---|---|---|
| CN | 114300012 | 4/2022 |
| TW | 202215434 | 4/2022 |

OTHER PUBLICATIONS

Jintao Zhang et al., "In-Memory Computation of a Machine-Learning Classifier in a Standard 6T SRAM Array," IEEE Journal of Solid-State Circuits, vol. 52, Apr. 2017, pp. 915-924.

(Continued)

*Primary Examiner* — Hien N Nguyen
(74) *Attorney, Agent, or Firm* — JCIPRNET

(57) ABSTRACT

A computing-in-memory circuitry includes multiple digital-to-analog converters, multiple computing arrays, and multiple charge processing networks. The digital-to-analog converters convert external data into input data and the digital-to-analog converters are connected in series with a corresponding plurality of output capacitor pairs. The computing arrays receive the input data from both ends and execute a computation to output a first computing value. The charge processing networks receive and accumulate the first computing values over a predetermined time interval through switching pairs in series with the output capacitor pairs. The charge processing networks evenly distribute charges of the first computing value to selected output capacitor pairs and compare voltage differences between two ends of the output capacitor pairs to output a second computing value.

20 Claims, 10 Drawing Sheets

(56) References Cited

U.S. PATENT DOCUMENTS

2022/0044714 A1\* 2/2022 Chang .................... G11C 11/419
2022/0115059 A1\* 4/2022 Li ............................ G11C 8/16
2022/0416801 A1\* 12/2022 Kao ...................... H03M 1/368

OTHER PUBLICATIONS

Avishek Biswas et al., "CONV-SRAM: An Energy-Efficient SRAM With In-Memory Dot-Product Computation for Low-Power Convolutional Neural Networks," IEEE Journal of Solid-State Circuits, vol. 54, Jan. 2019, pp. 217-230.

\* cited by examiner

COMPUTING-IN-MEMORY CIRCUITRY

TECHNICAL FIELD

The disclosure relates to a computing-in-memory circuitry, and in particular relates to a computing-in-memory circuitry using static random access memory.

RELATED ART

With the continuous advancement of artificial intelligence (AI) and machine learning (ML) technologies, the machine learning architecture based on neural networks has achieved excellent accuracy in applications such as speech and image recognition. Compared with traditional cloud computing, edge computing may achieve lower computing latency and better performance. At the same time, because the data does not need to be uploaded to the cloud, the risk of data being stolen by a third party is avoided, the security of the data may be effectively improved, and the dependence of the device on the network may also be reduced.

However, edge computing is limited by the energy and computing resources of terminal devices, making it extremely challenging to implement machine learning architectures on terminal devices. In response to terminal AI applications, the memory circuit architecture of computing-in-memory (CIM) is gradually emerging. By performing computations directly in the memory to avoid a large amount of data transfer, this memory architecture may not only break the memory bottleneck under the traditional Von Neumann architecture, but also realize the parallel operation of multiplication and addition, which greatly improves the overall computing performance. However, since computing-in-memory requires additional data conversion interfaces, including digital-to-analog and analog-to-digital converters, the performance of these analog components will affect the overall circuit throughput, power consumption, and area efficiency, which limits the performance of the memory of computing-in-memory, thereby limiting the application of this memory architecture.

It should be noted that the content of the "Related Art" section is used to help understand the disclosure. Some of the content (or all of the content) disclosed in the "Related Art" section may not be known by those of ordinary skill in the art. The content disclosed in the "Related Art" section does not mean that the content has been known to those with ordinary knowledge in the technical field before the application of the disclosure.

SUMMARY

The disclosure provides a computing-in-memory circuitry including multiple digital-to-analog converters, multiple computing arrays, and multiple charge processing networks. The digital-to-analog converters convert external data into input data, and the digital-to-analog converters are connected in series with a corresponding plurality of output capacitor pairs. The computing arrays receive the input data from both ends and execute a computation to output a first computing value. The charge processing networks receive and accumulate the first computing values over a predetermined time interval through switching pairs in series with the output capacitor pairs. The charge processing networks evenly distribute charges of the first computing value to selected output capacitor pairs and compare voltage differences between two ends of the output capacitor pairs to output a second computing value.

The disclosure provides a static random access memory of computing-in-memory (CIM SRAM) circuit architecture with high throughput, high energy, and area efficiency applied to terminal AI devices. By improving the data processing and conversion circuits, to overcome the current limitations of CIM SRAM in circuit performance, and by improving the problem of power consumption of the circuit and the problem of limited operation linearity, thereby the operation speed, energy efficiency and linearity of the overall memory are improved. Besides, the disclosure also provides a unified charge processing network (UCPN), which provides both signal processing and data conversion functions to improve energy efficiency, and at the same time improve circuit performance and chip area efficiency during the physical design of the chip.

The disclosure provides a computing-in-memory circuitry. In order to make the aforementioned features and advantages of the disclosure comprehensible, embodiments accompanied with drawings are described in detail below.

IMPLEMENTATION

Figure 1:
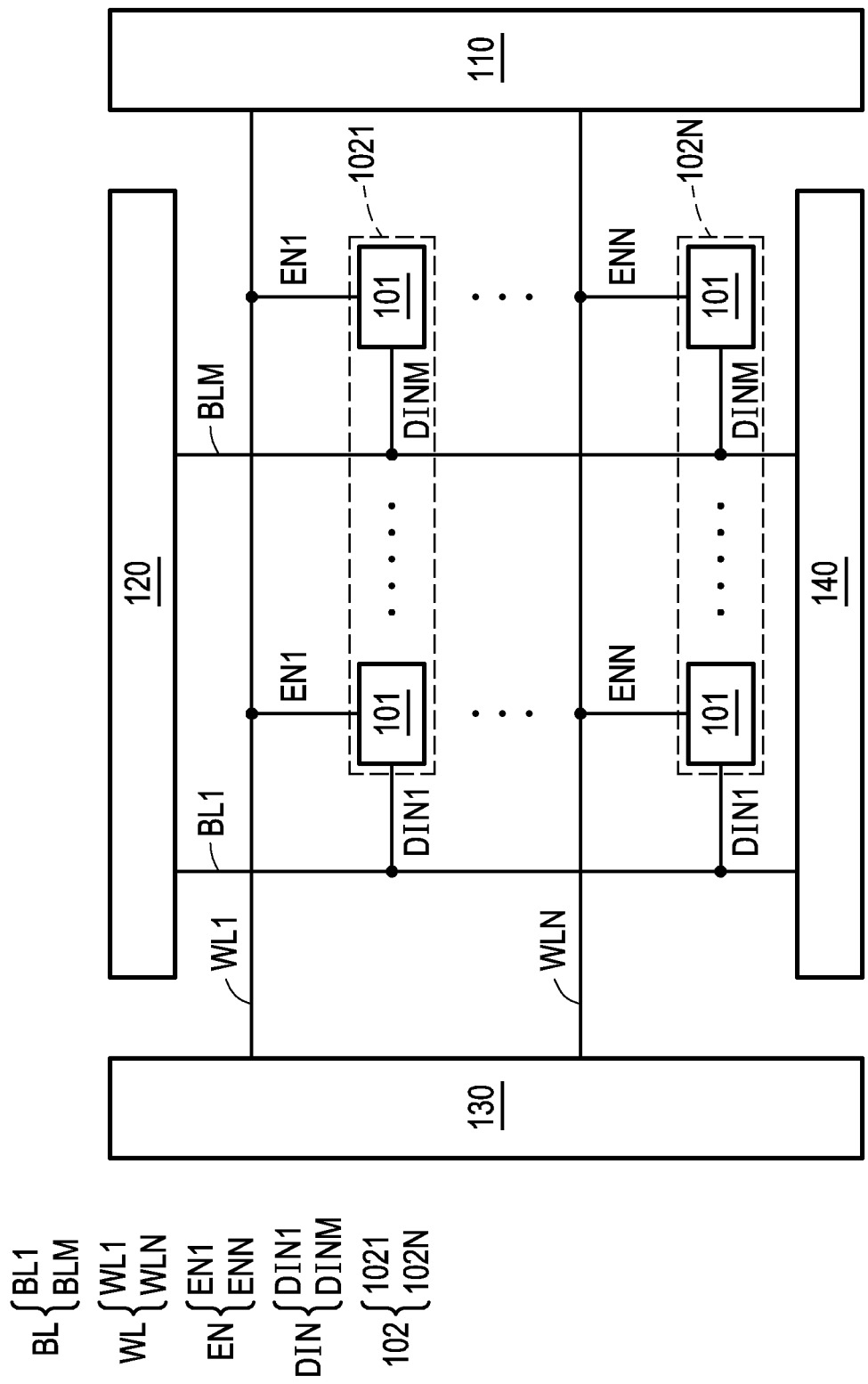
FIG. 1 is a circuit block schematic diagram of a computing-in-memory circuitry according to an embodiment of the disclosure.

The features of the inventive concept and methods of achieving the same may be more readily understood by reference to the following detailed description of the embodiments and the accompanying drawings. Hereinafter, embodiments will be described in more detail with reference to the accompanying drawings, in which the same reference numerals refer to the same elements throughout. However, the disclosure may be embodied in various different forms and should not be construed as limited to the embodiments set forth herein only. Rather, these embodiments are provided as examples so that this disclosure will be thorough and complete, and will fully convey the aspects and features of the disclosure to those skilled in the art. Therefore, processes, elements, and techniques that are not necessary for a person of ordinary skill in the art to have a complete understanding of the aspects and features of the disclosure may not be described. Unless otherwise indicated, the same reference numerals refer to the same elements throughout the accompanying drawings and written description, and thus their descriptions will not be repeated. In the drawings, the relative sizes of elements, layers, and regions may be exaggerated for clarity.

In the following description, for purposes of explanation, numerous specific details are set forth in order to provide a thorough understanding of various embodiments. It will be apparent, however, that various embodiments may be practiced without these specific details or without one or more equivalent arrangements. In other instances, well-known structures and devices are shown in block diagram form in order to avoid unnecessarily obscuring the various embodiments.

The terminology used herein is for the purpose of describing particular embodiments only and is not intended to limit the disclosure. As used herein, the singular form "a/an" is intended to include the plural form as well, unless the context clearly indicates otherwise. It should be further understood that the terms "comprises/comprising", "have/having", "includes/including" when used in this specification mean the presence of the stated features, integers, steps, operations, and/or elements, but does not preclude the presence or addition of one or more other features, integers, steps, operations, elements, and/or groups thereof. As used herein, the term "and/or" includes any and all combinations of one or more of the associated listed items.

As used herein, the terms "substantially," "about," "approximately," and similar terms are used as terms of approximation and not as terms of degree, and are intended to take into account measurements or inherent bias in calculations that would be recognized by one of ordinary skill in the art. Considering the discussed measurement and measurement-related deviation (that is, the limitation of measurement system), the usages of "about" or "approximately" include the stated value and indicate within an acceptable range of deviation from the particular value as determined by one of ordinary skill in the art. For example, "about" may mean within one or more standard deviations, or within ±30%, 20%, 10%, 5% of the stated value. Furthermore, when describing embodiments of the disclosure, the use of "may" means "one or more embodiments of the disclosure."

When a certain embodiment may be implemented in different ways, the particular order of processing may be performed differently from the described order. For example, two circuits or elements described in succession may be executed substantially concurrently or in the reverse order from that described.

Various embodiments are described herein with reference to cross-sectional illustrations that are schematic illustrations of embodiments and/or intermediate structures. Thus, variations from the shapes shown are to be expected as a result of, for example, manufacturing techniques and/or tolerances. Furthermore, specific structural or functional descriptions disclosed herein are merely illustrative for the purpose of describing embodiments in accordance with the concepts of the present disclosure. Accordingly, the embodiments disclosed herein should not be construed as limited to the particular shapes of the illustrated regions, but rather include shape deviations caused by, for example, manufacturing.

Electrical or electronic devices and/or any other related devices or elements described herein in accordance with embodiments of the disclosure may utilize any suitable hardware, firmware (e.g., application specific integrated circuits), software, or a combination of software, firmware, and hardware implementations. For example, the various elements of these devices may be formed on an integrated circuit (IC) chip or on separate IC chips. In addition, various elements of these devices may be implemented in flexible printed circuit films, tape carrier packages (TCP), printed circuit board (PCB), or formed on a substrate. Furthermore, various elements of these devices may be processes or threads running on one or more processors in one or more computing devices, executing computer program instructions, and interacting with other system elements for performing the various functions described herein. Computer program instructions are stored in memory that may be implemented in a computing device using standard memory devices such as random access memory (RAM). Computer program instructions may also be stored in other non-transitory computer readable media such as CD-ROMs, flash memory drives, or the like. Furthermore, those skilled in the art will recognize that the functionality of various computing devices may be combined or integrated into a single computing device, or that the functionality of a particular computing device may be distributed over one or more other computing devices without departing from the spirit and scope of the exemplary embodiments of the disclosure.

Unless otherwise defined, all terms (including technical and scientific terms) used herein have the same meaning as commonly understood by one of ordinary skill in the art to which this disclosure belongs. It should be further understood that terms such as those defined in commonly used dictionaries should be construed as having meanings consistent with their meanings in the context of the related art and/or this specification, and are not to be construed as idealized or excessive formal meaning, unless expressly defined as such herein.

In order to realize emerging AI applications, a computing-in-memory (CIM) architecture is proposed to improve the computational efficiency of machine learning processing tasks. Since the CIM architecture performs computations directly in memory, a large amount of data movement is avoided. This makes energy use much more efficient than traditional Von Neumann computing architectures, where energy losses are mainly caused by data movement. The advantage of CIM static random access memory is that it may directly process information obtained from the bit line (BL), so that the energy required to move the data is minimized, and data may be parallelized to perform efficient multiplication and accumulation (MAC) computations. Although CIM SRAM may achieve higher energy efficiency, its operating frequency and throughput are relatively lower than existing ML accelerators. Therefore, the space in which the CIM SRAM may be applied is limited. Therefore, it is necessary to further improve the throughput and execution efficiency of the CIM SRAM circuit architecture, so that its operation speed and throughput performance may be matched with high-speed operations or high-performance ML accelerators to achieve high-speed operations or high-performance AI applications.

The CIM SRAM of the disclosure uses MAC computing processing and data conversion circuits to support ML computing tasks. First, the disclosure adopts bit line control with charge redistribution architecture for efficient MAC computation. With this architecture, the classification performance of CIM SRAM may be effectively improved without being affected by the non-ideal effects caused by the access transistor of SRAM, such as transistor mismatch and data-dependent current characteristics.

Besides, the disclosure also adopts a dynamic binary-weighted current-steering digital-to-analog converter (DAC) architecture to improve energy efficiency and linearity performance under high-speed operation. In addition, a unified charge processing network (UCPN) is also used to provide efficient signal processing and data conversion functions at the same time, in addition to effectively improving throughput and energy-area-efficiency, it also respectively overcomes the performance bottleneck of CIM SRAM caused by the use of additional data processing and conversion circuits.

On the other hand, the disclosure also uses a successive-approximation analog-to-digital converter (successive-approximation ADC; SAR ADC) circuit architecture with bottom-plate sampling to improve data conversion performance. This architecture may not only reduce the energy loss in the CIM SRAM circuit architecture, but also effectively improve the output resolution and conversion time and realize fast conversion speed to achieve a high-performance CIM SRAM with high-throughput and high-resolution.

Referring to FIG. 1, FIG. 1 is a circuit block schematic diagram of a computing-in-memory circuitry according to an embodiment of the disclosure.

In this embodiment, a computing-in-memory circuitry 100 includes: multiple charge processing networks 110, multiple digital-to-analog converters (DACs) 120, multiple computing arrays (101, 1021, 102N), at least one driving circuit (and/or a decoding circuit) 130, and an input output circuit 140 for reading and writing data. The multiple computing arrays include multiple computing banks (1021, 102N).

In this embodiment, the decoding circuit 130 is configured to receive an input enable signal (not shown) to decode the encoded external data to obtain the decoded corresponding address. Each address corresponds to a specific computation (or memory) unit in the computing arrays (101, 1021, 102N). The driving circuit 130 drives at least one of multiple computing arrays (101, 1021, 102N) corresponding to the corresponding addresses through multiple word lines (WL, WL1, WLN), and is electrically connected with an analog-to-digital converter (ADC) through the word lines (WL, WL1, WLN). In this embodiment, the ADC is a SAR ADC. In an embodiment, the ADC may also be a flash ADC, a pipeline ADC, or a pipeline successive approximation ADC (pipeline-SAR ADC), which is not limited in this embodiment.

In this embodiment, multiple DACs 120 are configured to convert the digital external data inputted by the input-output circuit 140 into analog input data DIN, DIN1, and DINM. In this embodiment, each of the DACs 120 is in series with a corresponding plurality of output capacitor pairs (see below).

In this embodiment, the computing arrays (101, 1021, 102N) receive input data (DIN, DIN1, DINM) from the bit lines (BL, BL1, BLM) from the corresponding both ends (ports). After the word lines (WL, WL1, WLN) are turned on at a specific address, the computation enable signals (EN, EN 1, EN N) is output, and the input data (DIN, DIN1, DINM) on the bit line (BL, BL1, BLM) and the computation (or memory) unit 101 undergo computation. For example, the computation (or memory) unit 101 may be formed of a latch (not shown) that is formed of two symmetrical access transistors (or pass transistors) (2T) (not shown) and four transistors (4T). For example, one of the transistors on the left is connected to the word line, and the other transistor on the left is connected to the latch. In other words, in this embodiment, the computation unit 101 is formed of a static random access memory (SRAM) formed by 10 transistors, which is not limited in the disclosure.

The latch may store two complementary logic voltage levels as weights at both ends. For example, both ends of the latch may store a logic 1 or a logic 0. For example, when the word line WL is turned on, one end of the pass transistor connected to the latch has a weight of logic 1, then in this example, after multiplication with the weight, the input data (DIN, DIN1, DINM) originally located on the bit line BL is released through the pass transistor, and the output computing value (output voltage or output current) on the bit line BL is logic 0. Conversely, when the word line WL is turned on, one end of the pass transistor connected to the latch has a weight of logic 0, then in this example, after multiplication with the weight, the input data (DIN, DIN1, DINM) originally located on the bit line BL is released through the pass transistor, and the output computing value (output voltage or output current) on the bit line BL is logic 1. Therefore, after multiplication with the weight, the ends of the bit line BL connected to both ends of the symmetrical SRAM have complementary logic levels. In other words, the corresponding two bit lines BL connected to the computation (or memory) unit 101 have complementary logic levels. In other words, if one of the bit lines connected to the computation (or memory) unit 101 has a voltage level such as a logic 1, the other bit line (or called an inverse bit line) has a complementary inverting voltage level such as a logic 0.

In one embodiment, the latch may be a latch formed of SR flip-flops, which is not limited here. The latch may be used as clock gating to memorize the comparison state of the current time period without changing the state of the signal in the next cycle, so it may reduce the switching of the clock signal and effectively reduce the dynamic power consumption of the circuit, and may optimize the clock tree structure at the same time to reduce setup timing and increase the efficiency of voltage conversion.

If the charge processing network 110 receives and accumulates a first computing value (i.e., the computing value multiplied by the weight) within a predetermined time interval through a switching pair in series with the output capacitor pair (see below). On one hand, the charge processing network 110 transfers the stored charges of multiple output capacitor pairs to a global read bit line (see below) for accumulation, on the other hand, the charge of the first computing value is evenly distributed to the selected (or "valued", "logic level non-0") output capacitor in the output capacitor pairs through multiple bit lines BL (i.e., perform the first multiplication and then the accumulation computation, and then take the average value), and finally, the accumulated and averaged voltage difference between the two ends is input into the comparator for comparison, and a second computing value is output based on the comparison result. In other words, the voltage difference of the global read bit line (see below) is sent to the SAR ADC for computation, and the output computing value is exactly the result of multiplying and averaging the input data DIN, DIN1, DINM and the weight.

Figure 2:
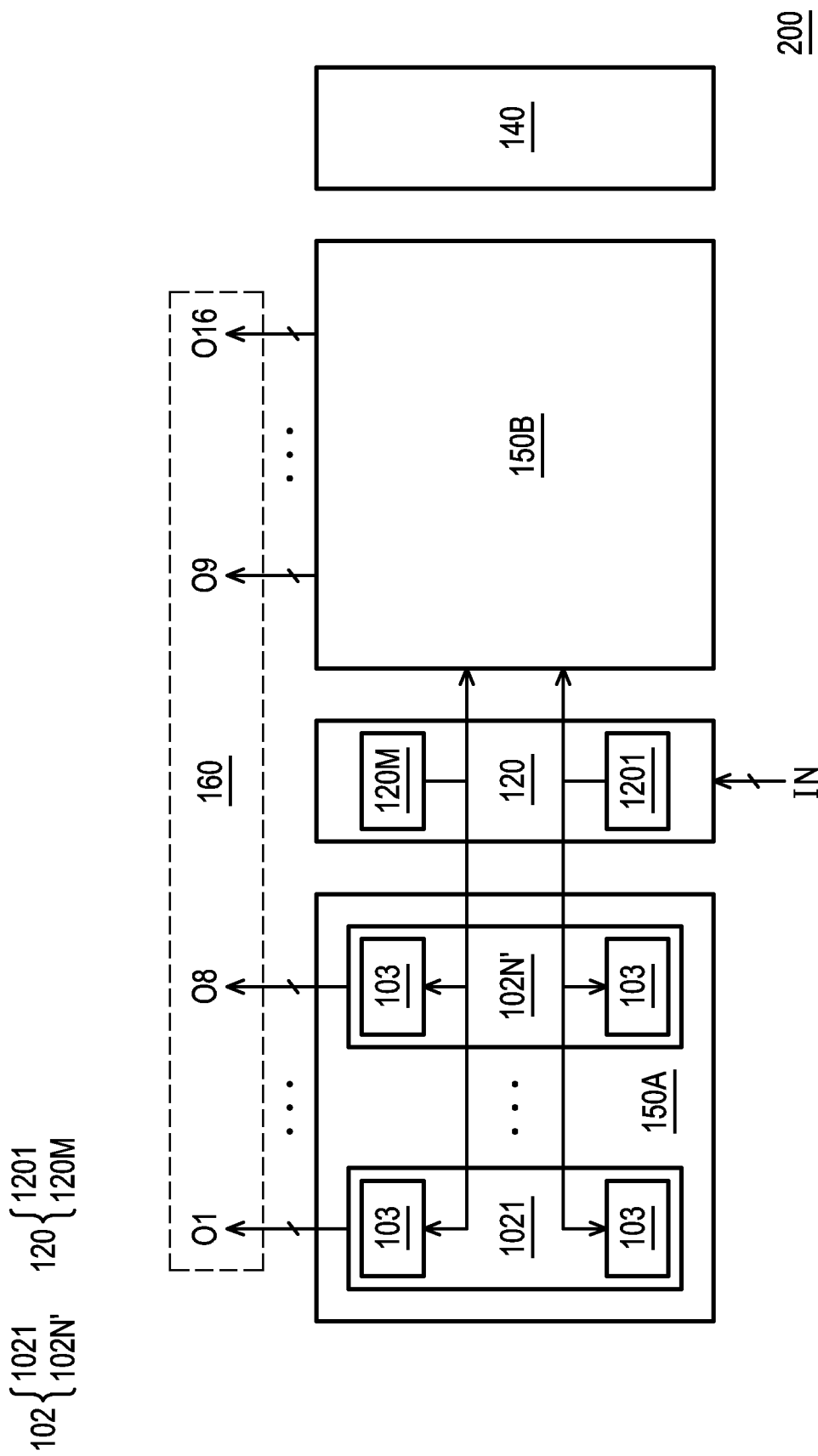
FIG. 2 is a partial circuit block schematic diagram of a computing-in-memory circuitry according to an embodiment of the disclosure.

Referring to FIG. 2, FIG. 2 is a partial circuit block schematic diagram of a computing-in-memory circuitry according to an embodiment of the disclosure.

FIG. 2 shows an exemplary architecture of the CIM SRAM circuit system 200 provided by the disclosure. In this embodiment, the CIM SRAM circuit system 200 is formed of 64 7-bit DACs (120, 1201, 120M), 16 computing banks (102, 1021, 102N'), CIM SRAM macro 150A and 150B, and the input output circuit 140. The convolution output 160 is a collection of the outputs (O9, O16) (e.g., having 8 outputs) computed from the CIM SRAM macro 150B and the outputs (O1, O8) (e.g., having 8 outputs) computed from the computing banks (102, 1021, 102N') of the CIM SRAM macro 150A. In this embodiment, the data conversion capability provided by the CIM SRAM circuit system 200 is equivalent to 16 ADCs with 7-bit resolution. In this embodiment, the maximum filter depth is 64. In this embodiment, each computing bank (102, 1021, 102N') includes multiple local computing units (LCU) 103. In one embodiment, the CIM SRAM macro 150 includes 8 computing banks (not shown). In other words, the computing banks (not shown) and the computing banks (102, 1021, 102N') in the CIM SRAM macro 150 constitute a CIM SRAM circuit system 200 with 16 computing banks.

In this embodiment, the LCU 103 receives the digital external signal IN from the DAC (120, 1201, 120M) and converts it into a corresponding analog input signal (voltage), so as to pre-charge the computing banks (102, 1021, 102N'). Next, a multiplication computation is performed in the computing banks (102, 1021, 102N'). Finally, the UCPN accumulates the result of the multiplication computation and outputs the corresponding digital signal.

Figure 3:
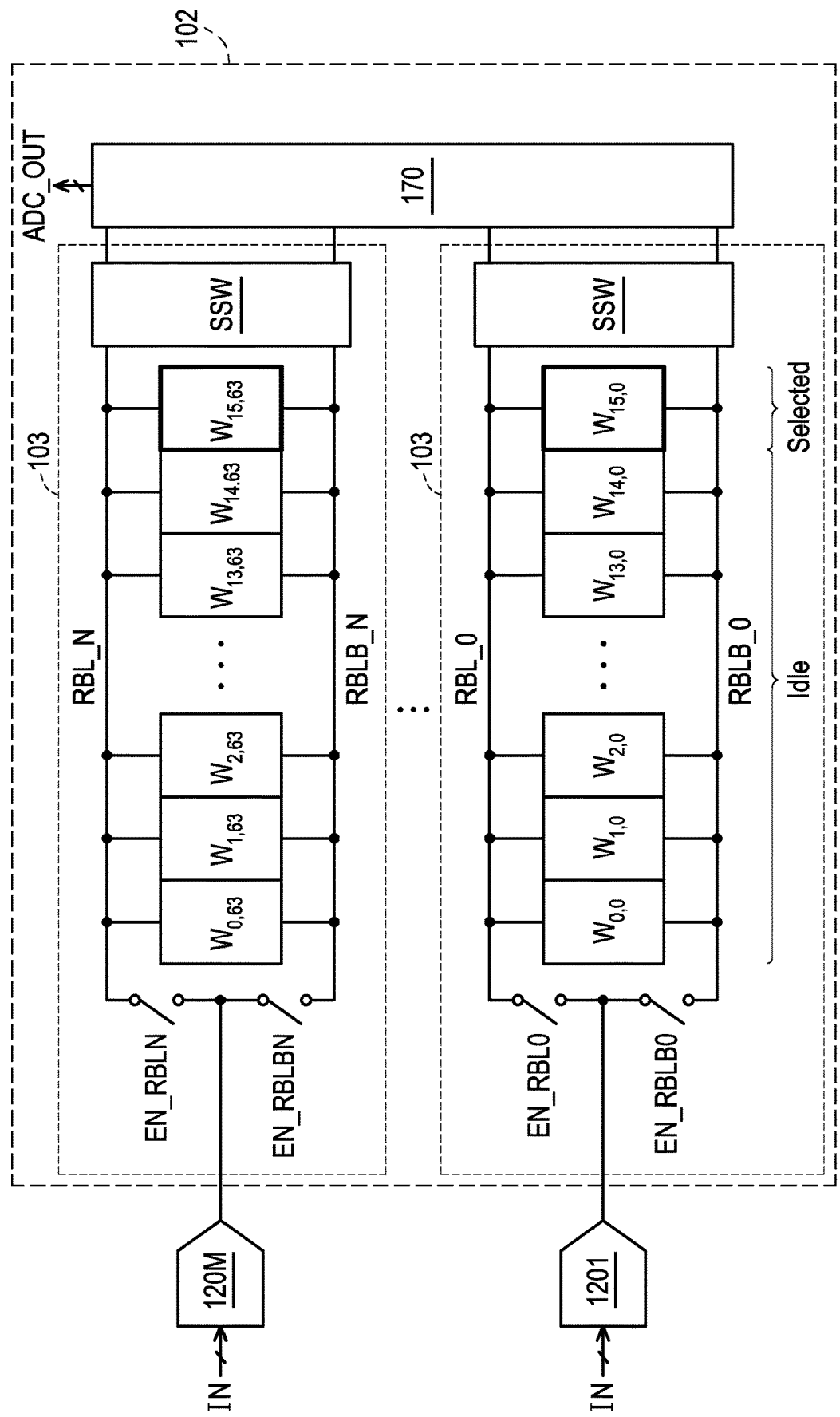
FIG. 3 is a block schematic diagram of a computing bank of an embodiment of FIG. 2 according to the disclosure.

Referring to FIG. 3, FIG. 3 is a block schematic diagram of a computing bank of an embodiment of FIG. 2 according to the disclosure.

In this embodiment, the computing bank 102 includes multiple LCUs 103, multiple computation units, signals (or switches) (EN_RBL0, EN_RBLB0, EN_RBLN, EN_RBLN) that control whether input data is transferred to the computation unit through the corresponding complementary bit lines (RBL_0, RBLB_0, RBL_N, RBLB_N), sign bit switch SSW, and charge processing network 170. In this embodiment, the charge processing network 170 outputs a computing value ADC OUT through the ADC after being computed. The computing value ADC OUT output by the ADC is a 7-bit output signal.

In this embodiment, the computation unit includes multiple weight units ($W_{0\ldots0}, \ldots, W_{15\ldots63}$). In an embodiment, the weight unit of the computation unit is not limited. In this embodiment, the weight units ($W_{0\ldots0}, \ldots, W_{15\ldots0}$) and ($W_{0\ldots63}, \ldots, W_{15\ldots63}$) are connected in parallel with each other. Both ends of each of the weight units ($W_{0\ldots0}, \ldots, W_{15\ldots0}$) and ($W_{0\ldots63}, \ldots, W_{15\ldots63}$) are respectively electrically connected to at least one of the corresponding bit line pairs. For example, both ends of the weight unit ($W_{0\ldots0}, \ldots, W_{15\ldots0}$) are respectively electrically connected to the bit line pairs RBL_0 and RBLB_0. Each of the weight units ($W_{0\ldots0}, \ldots, W_{15\ldots63}$) stores the corresponding weight (logic 0 or logic 1). On the other hand, both ends of the weight units ($W_{0,63}, \ldots, W_{15\ldots63}$) are respectively electrically connected to the bit line pairs RBL_N and RBLB_N. Each of the weight units ($W_{0\ldots0}, \ldots, W_{15\ldots63}$) stores the corresponding weight (logic 0 or logic 1). In one embodiment, the weight stored in each of the weight units ($W_{0\ldots0}, \ldots, W_{15\ldots63}$) may be determined in advance according to computation requirements, which is not limited in this embodiment.

In this embodiment, when the computation is executed with the corresponding weights of the weight units ($W_{0\ldots0}, \ldots, W_{15\ldots0}$) and ($W_{0\ldots63}, \ldots, W_{15\ldots63}$) fixed, the computation is executed based on one of the selected weight units (for example, $W_{15\ldots0}$ or $W_{15\ldots63}$), and the remaining weight units that are not selected (for example, $W_{0\ldots0}, \ldots, W_{14\ldots0}$ or $W_{0\ldots63}, \ldots, W_{14\ldots63}$) maintain in an idle state.

In this embodiment, both ends of the sign bit switch SSW are respectively electrically connected to at least one of the corresponding bit line pairs (RBL_0, RBLB_0) and (RBL_N, RBLB_N), in which, before the pre-charge period, the corresponding sign bit switch is determined based on the positive and negative values of the input data. In other words, in this embodiment, the sign bit switch SSW is used to control the bit line pairs (RBL_0, RBLB_0) and (RBL_N, RBLB_N) to generate positive and negative values (positive and negative voltages) from the input information (input signal).

Figure 4:
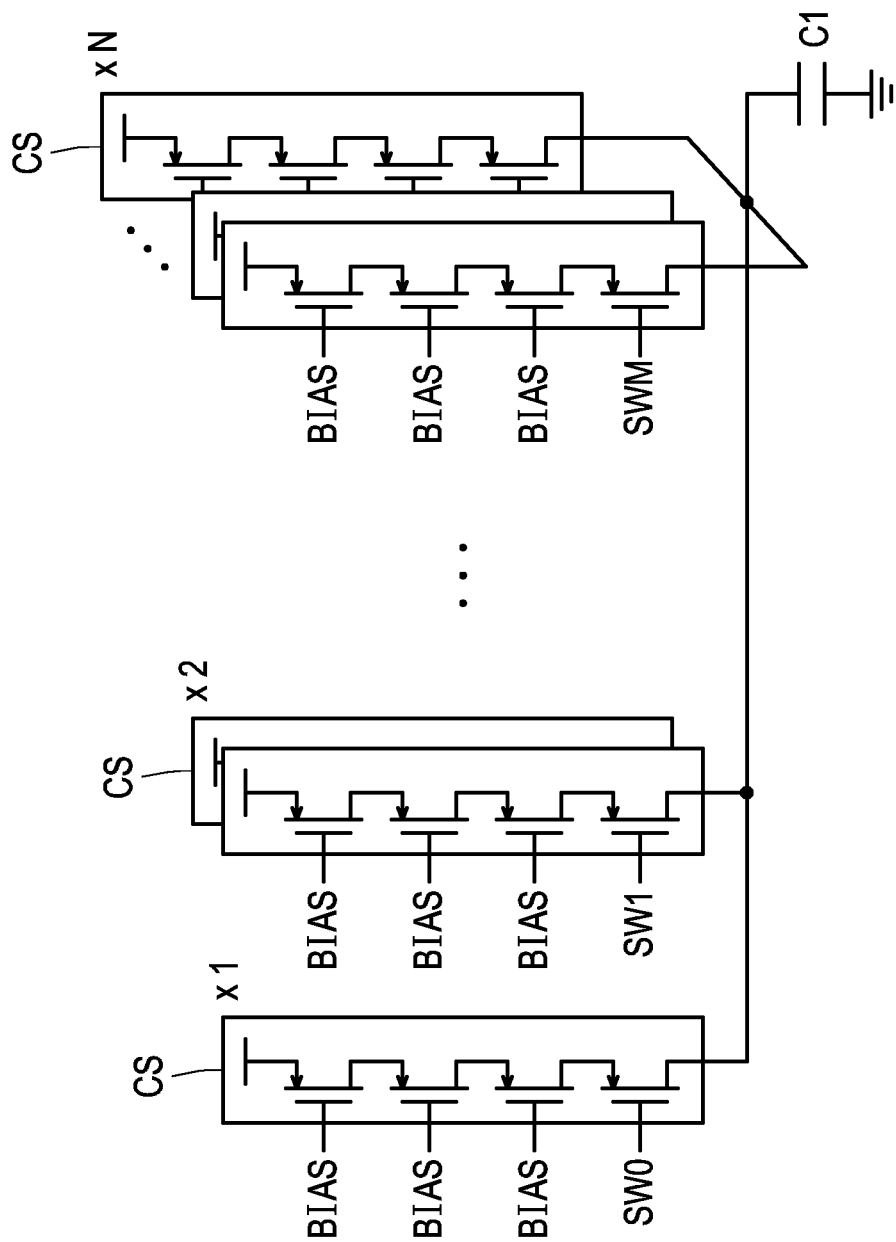
FIG. 4 is a circuit schematic diagram of a digital-to-analog converter (DAC) according to an embodiment of the disclosure.

Referring to FIG. 4, FIG. 4 is a circuit schematic diagram of a digital-to-analog converter (DAC) according to an embodiment of the disclosure.

Referring to FIG. 3 and FIG. 4 at the same time, in this embodiment, the DACs (120, 1201, 120M) are dynamic binary-weighted current-steering DACs. In this embodiment, the DACs (120, 1201, 120M) include a dynamic binary-weighted current source array CS, and multiple logic voltage level complementary bit line pairs connected in series with multiple output capacitor pairs C1. In other words, the DACs (120, 1201, 120M) include a dynamic binary-weighted current source array CS formed of multiple current source switches SW0, SW1, SWM. With these current source switches SW0, SW1, and SWM, the required current source array CS may be selected or switched according to the input data to provide corresponding current. In one embodiment, the input data from the DACs (120, 1201, 120M) are current-steered data. In one embodiment, the input data from the DACs (120, 1201, 120M) are voltage-steered data.

In one embodiment, the DACs (120, 1201, 120M) have multiple sets of parallel connected (or parallel) current source sets. For example, the current source set includes at least one current source CS. In an alternative embodiment, the DACs (120, 1201, 120M) have multiple sets of parallel connected current source sets, in which each set of current source sets includes multiple current sources CS connected in parallel to each other. In an alternative embodiment, the number of current sources CS connected in parallel to each other in each current source set is in a power-of-2 sequence. For example, the first set of current source sets has one current source CS, the second set of current source sets has two current sources CS connected in parallel with each other, ..., the fifth set of current source sets has thirty-two current sources CS connected in parallel with each other, in other words, the N value of FIG. 4 is 32, and so on. In one embodiment, each current source CS includes at least one switch SW0, SW1, and SWM. For example, the first set of current source sets has one current source CS, three gate bias voltages BIAS, and one current source switch SW0. For example, the second set of current source sets has two current sources CS, each current source CS includes three gate bias voltages BIAS, and one current source switch SW1. In other words, the second set of current source sets has two current source switches SW1. For example, the fifth set of current source sets has five current sources CS connected in parallel with each other, each current source CS includes three gate bias voltages BIAS, and one current source switch SWM. In other words, the fifth set of current source sets has five current source switches SWM. In one embodiment, the number of current sources connected in parallel with each other in the current source set is not limited, and may be designed according to requirements.

In this embodiment, the DACs (120, 1201, 120M) include an output capacitor C1 formed of multiple bit lines RBL and RBLB and capacitors CRBL and CRBLB (refer to FIG. 5) on multiple bit lines. With this DAC (120, 1201, 120M) architecture design, the energy efficiency of the DAC may be increased by 2.01 times, and its linearity may be effectively improved to 0.65 ENOB (effective number of bits). ENOB is the effective number of bits, a parameter configured to measure the conversion quality (in bits) of the data converter relative to the input signal in the Nyquist bandwidth.

Figure 5:
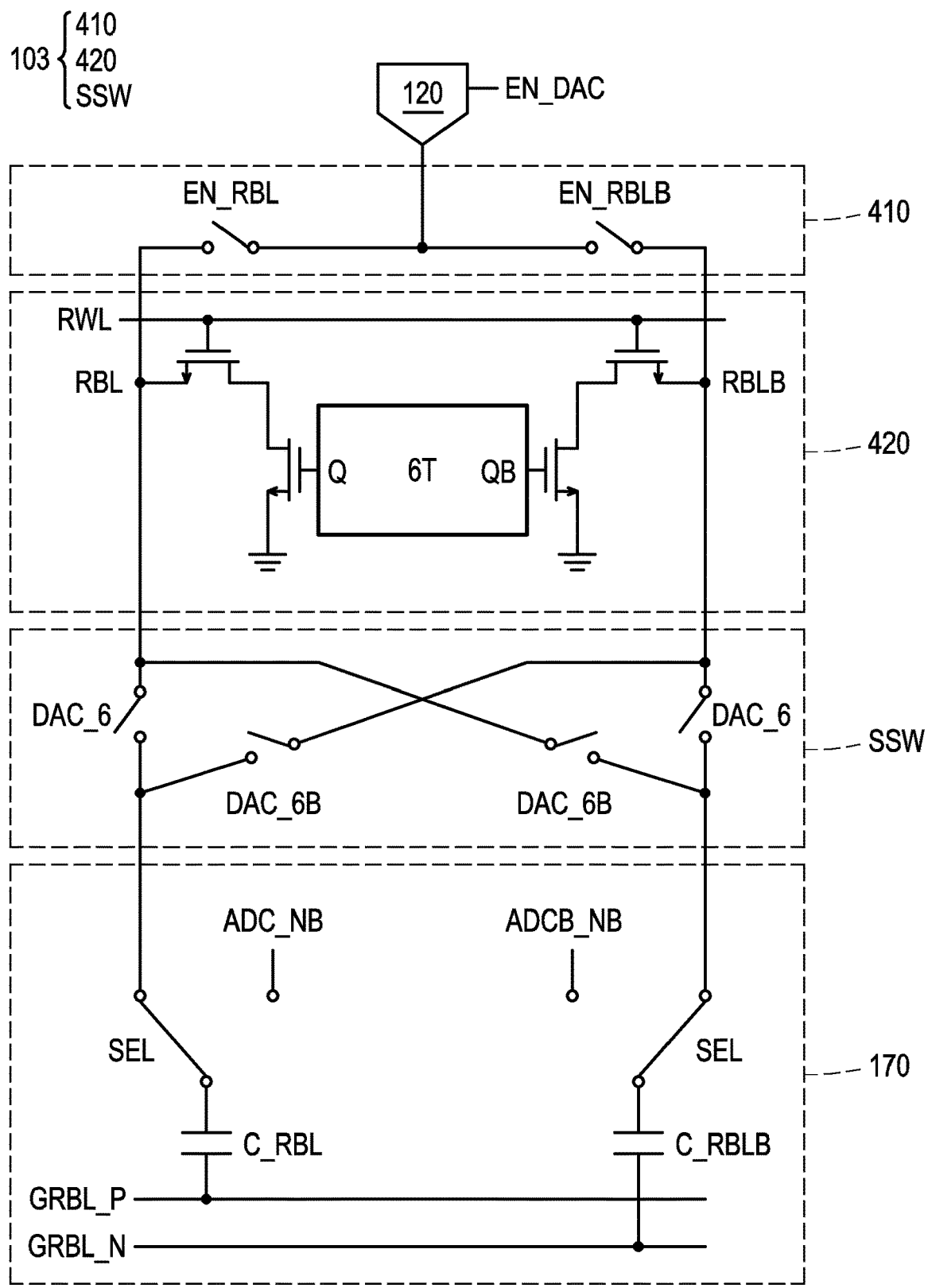
FIG. 5 is a circuit schematic diagram of a local computing unit (LCU) according to an embodiment of the disclosure.

Referring to FIG. 5, FIG. 5 is a circuit schematic diagram of a local computing unit (LCU) according to an embodiment of the disclosure.

In this embodiment, a LCU 103 includes two DAC input switches 410, sixteen memory cells 420, four sign bit switches SSW, and a charge processing network 170.

In an exemplary embodiment, there are sixty four LCUs 103 on the same row of the computing array, and sixteen 10T SRAM cells are used as storage locations for filtering computations in each LCU 103, in which fifteen sets are idle SRAM cells, and each computation only activates one set of SRAM cells. In the actual computation process, the required SRAM cells may be switched at any time according to different requirements or algorithms.

In this embodiment, the DAC input switch 410 includes bit line enable signals (switches) EN_RBL and EN_RBLB. The bit line enable signals (switches) EN_RBL and EN_RBLB are configured to determine whether to allow the input information from the DAC 120 to be received. The DAC 120 is based on the DAC enable signal EN DAC to determine whether to enable the DAC for operating.

In this embodiment, the memory cell 420 includes complementary bit lines RBL and RBLB, a word line RWL that simultaneously controls whether multiple pass transistors are turned on during a reading period, two symmetrical access transistors (2T), and a latch formed of four transistors (4T), in which the latches have complementary output ends Q, QB. In other words, the memory cell 420 is an architecture formed of sixteen 10T SRAMs.

In this embodiment, the four sign bit switches SSW include a DAC input control signal DAC_6 that controls whether the bit line RBL may transmit input information (signal) to a global read bit line GRBL_P in the charge processing network 170, the DAC input control signal DAC_6 that controls whether the bit line RBLB may transmit the inverted input information (signal) to a global read bit line GRBL_N in the charge processing network 170, a DAC input control signal DAC_6B that controls whether the bit line RBL may transmit the inverted input information (signal) to the global read bit line GRBL_P in the charge processing network 170, and the DAC input control signal DAC_6B that controls whether the bit line RBLB may transmit the inverted input information (signal) to the global read bit line GRBL_N in the charge processing network 170.

In this embodiment, the four sign bit switches adopt a cross-coupling configuration, so that the input information (signal) has the form of positive and negative voltages.

In this embodiment, the charge processing network 170 has two ADC switch nodes to receive the output information (signal) of the ADC, in which the output information (signal) outputs corresponding ADC input control signals ADC_NB and ADCB_NB through an inverter (not shown) whose one end receives an ADC reference voltage.

In one embodiment, the inverter may be configured to perform a bitwise inversion computation (i.e., one's complement) on the input information (signal), and then add 1 to the result, which is the two's complement of the value. In the two's complement system, a negative number is represented by the two's complement of its corresponding positive number. The two's complement system may be used in addition or subtraction processing without using different calculation methods because of the positive and negative numbers. Signed addition may be processed using only one type of adder circuit. Similarly, subtraction may be represented by the addition of one number and the two's complement of another number, so as long as the adder circuit and the two's complement circuit are used, various signed numbers may be added and subtracted.

In the present embodiment, the charge processing network 170 also has two switches SEL configured to correspondingly switch between the bit line RBL and the input control signals ADC_NB and ADCB_NB.

Referring to FIG. 6A to FIG. 6D, FIG. 6A to FIG. 6D are operation steps schematic diagrams and time sequence diagrams of different stages of an LCU according to an embodiment of the disclosure.

In this embodiment, the multiplication computation performed by the LCU includes three steps: the DAC pre-charge period T1, the multiplication computation period T2, and the data transmission period T3.

In this embodiment, before the DAC pre-charge period T1, firstly set the DAC sign bit switch according to the sign bit to be activated, and correspondingly connect the bottom-plates of the output capacitors C_RBL and C_RBLB to the bit lines RBL and RBLB. Referring to the operation mode of operation 610, during the DAC pre-charge period T1, the bit line enable signal (switch) EN_RBL and the DAC enable signal EN DAC are activated. The two global read bit lines GRBL_P and GRBL_N connected to the output capacitors C_RBL and C_RBLB are initially grounded to discharge the voltage on the global read bit lines GRBL_P and GRBL_N to ground voltage level (e.g., logic 0) to ensure that the voltage difference between the two output capacitors C_RBL and C_RBLB is the voltage at which the DAC is pre-charged.

In this embodiment, referring to the operation mode of operation 620, during the multiplication computation period T2, the pre-charge path is open (i.e., the bit line enable signal (switch) EN_RBL is open). The output capacitors C_RBL and C_RBLB maintain the DAC pre-charge voltage during the pre-charge period T1. Next, the word line RWL is enabled for multiplication. Based on the weight unit data stored in the SRAM, the voltage on bit line RBL or bit line RBLB discharges to zero. After the discharge process is completed, the word line RWL is disabled to complete the multiplication calculation.

In this embodiment, referring to the operation mode of operation 630, during the data transmission period T3, the bottom-plate of the output capacitors C_RBL and C_RBLB is switched to the ADC switch node in the UCPN 170 based on the switch (signal) SEL. The transmitted data (charge) is accumulated on the global read bit lines GRBL_P and GRBL_N. Correspondingly, referring to FIG. 6D, the voltage swings on the global read bit lines GRBL_P and GRBL_N gradually decrease as the time of the data transmission period T3 increases. In one embodiment, during the data transmission period T3, the voltage swing on the global read bit line GRBL_N is initially higher than the voltage swing on the global read bit line GRBL_P. During the later stage of the data transmission period T3, the voltage swing on the global read bit line GRBL_N will gradually tend to be the same as the voltage swing on the global read bit line GRBL_P. The output waveform diagram of the ADC shows the change of the output signal ADC OUT of the ADC. The output signal ADC OUT of the ADC is a 7-bit output signal during the data transmission period T3. Finally, it is further processed in UCPN 170 and converted to a digital output. In this embodiment, the output capacitor pairs C_RBL and C_RBLB have substantially the same capacitance value. In one embodiment, all the output capacitors C_RBL and C_RBLB have the same capacitance value to form a unitary capacitor array. During the data transfer period T3, the capacitor array 720 (see FIG. 7) is reusable in the UCPN 170. In one embodiment, in each iterative computation of the SAR ADC, different numbers of output capacitors C_RBL and C_RBLB are gradually switched by powers of 2 to achieve dynamic binary-weighted capacitor switching.

Figure 6A:
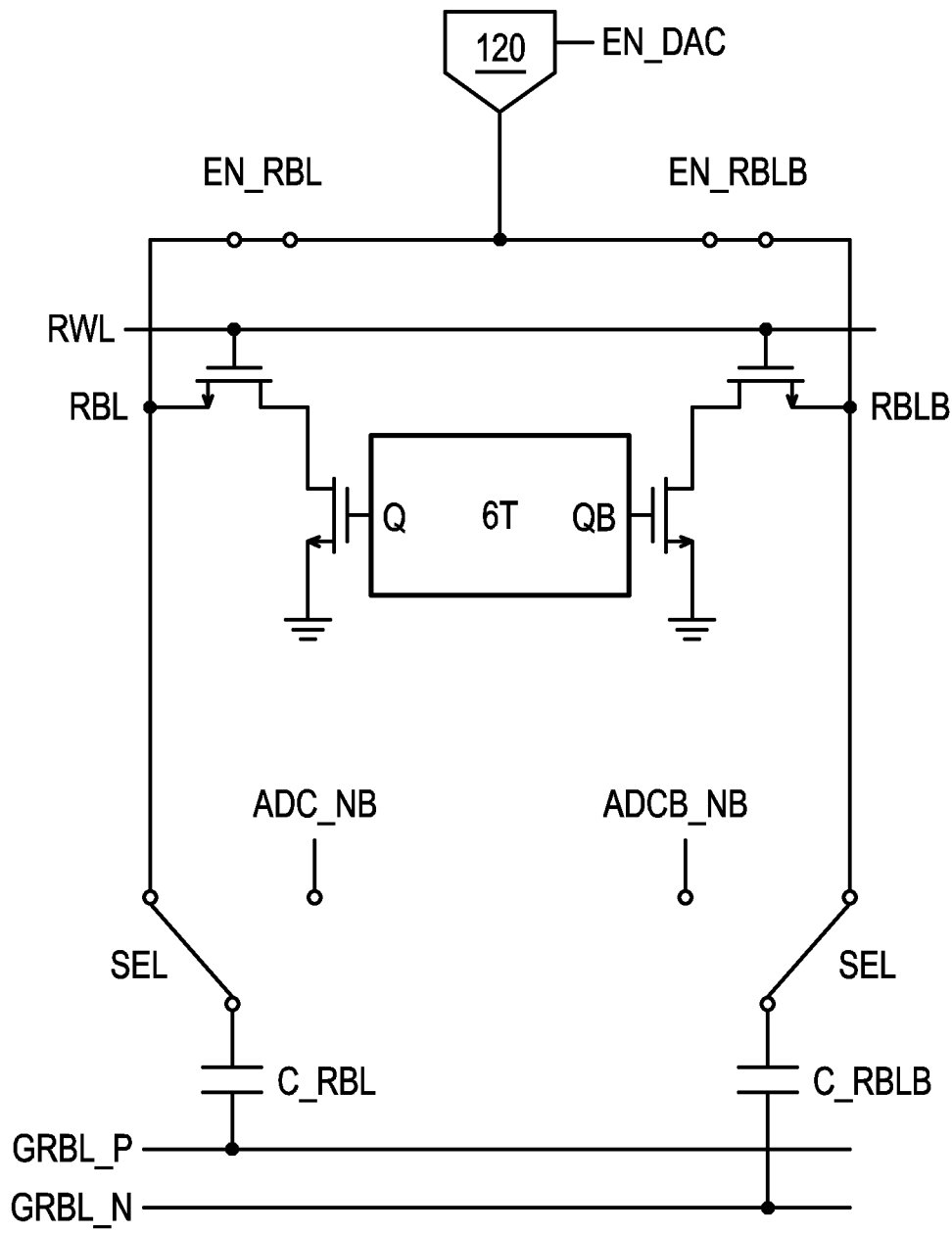
FIG. 6A to FIG. 6D are operation steps schematic diagrams and time sequence diagrams of different stages of an LCU according to an embodiment of the disclosure.
Figure 6B:
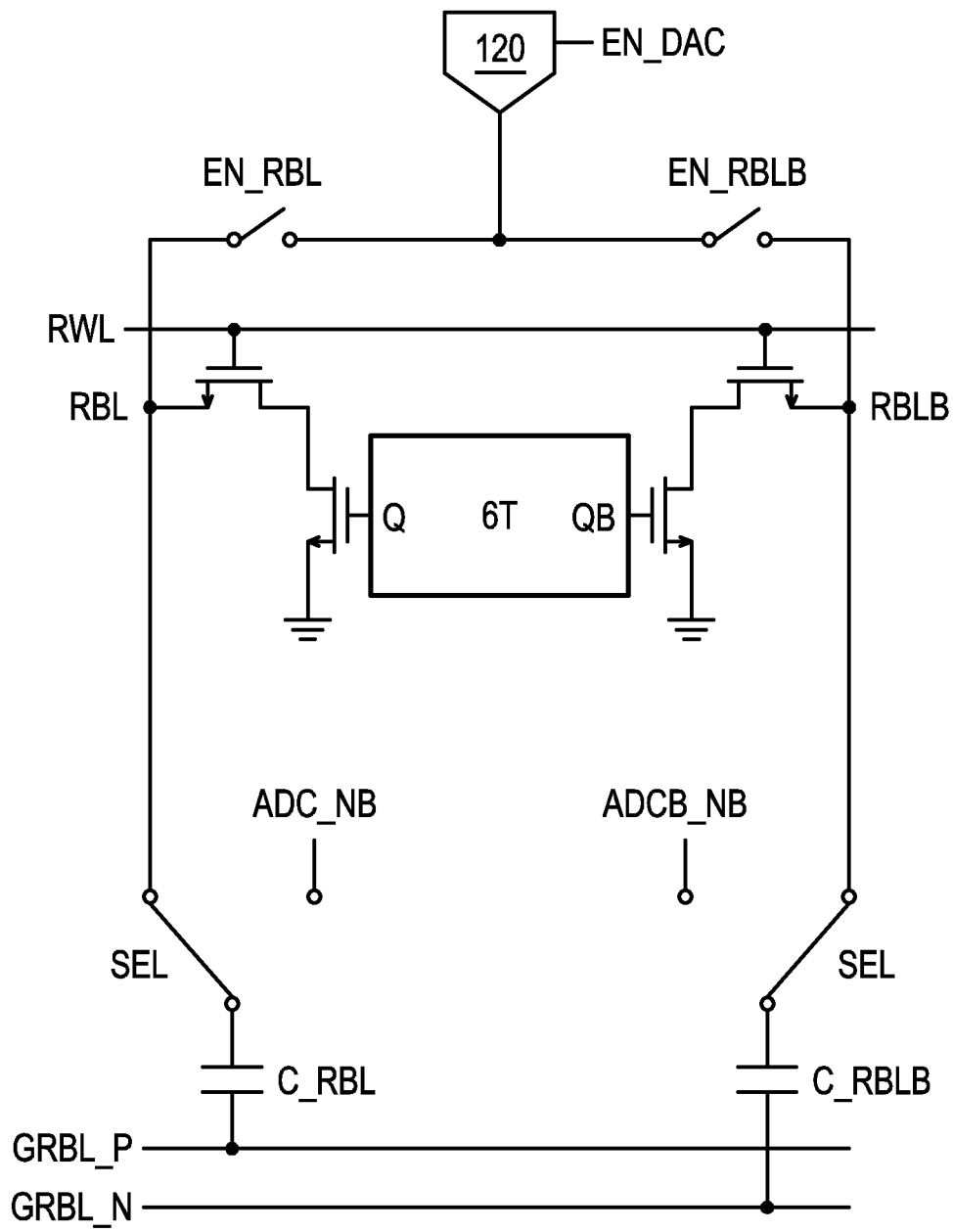
Figure 6C:
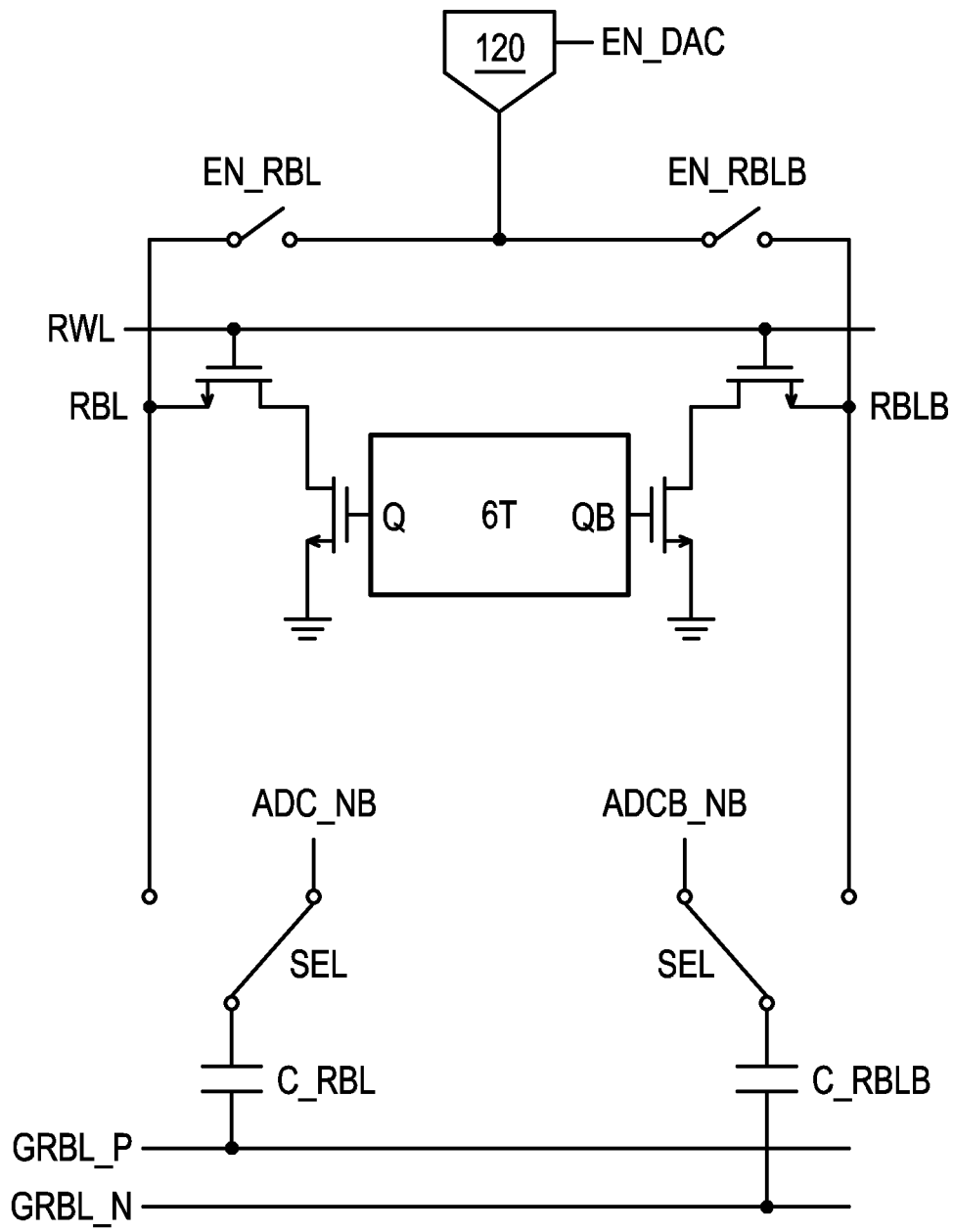
Figure 6D:
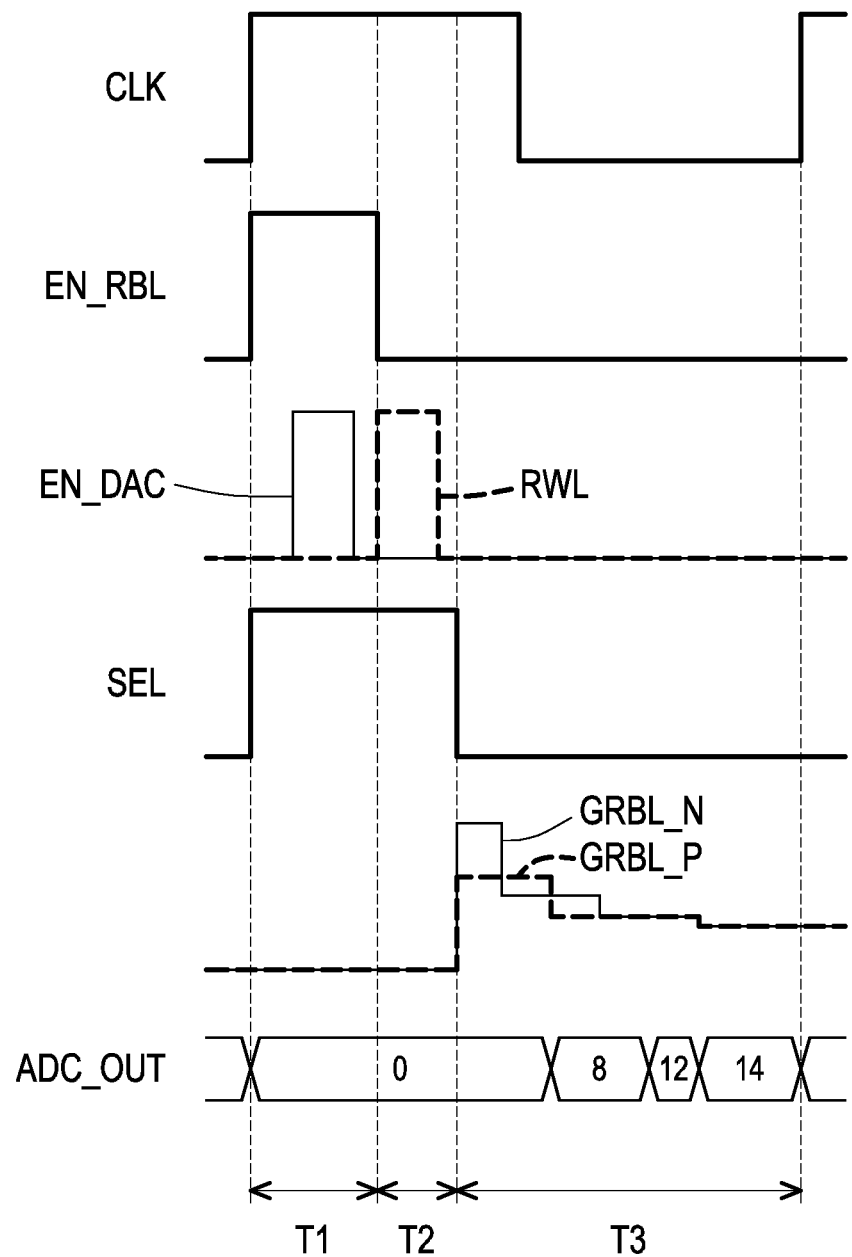

Referring to FIG. 6D, the waveform relationship of the DAC pre-charge period T1, the multiplication computation period T2, and the data transmission period T3 may be referred to FIG. 6A to FIG. 6C and the description above, and those skilled in the art may clearly interpret the waveform relationship, so it is not repeated herein. In this embodiment, a complete cycle of the clock signal CLK includes a pre-charge period T1, a multiplication computation period T2, and a data transmission period T3.

Figure 7:
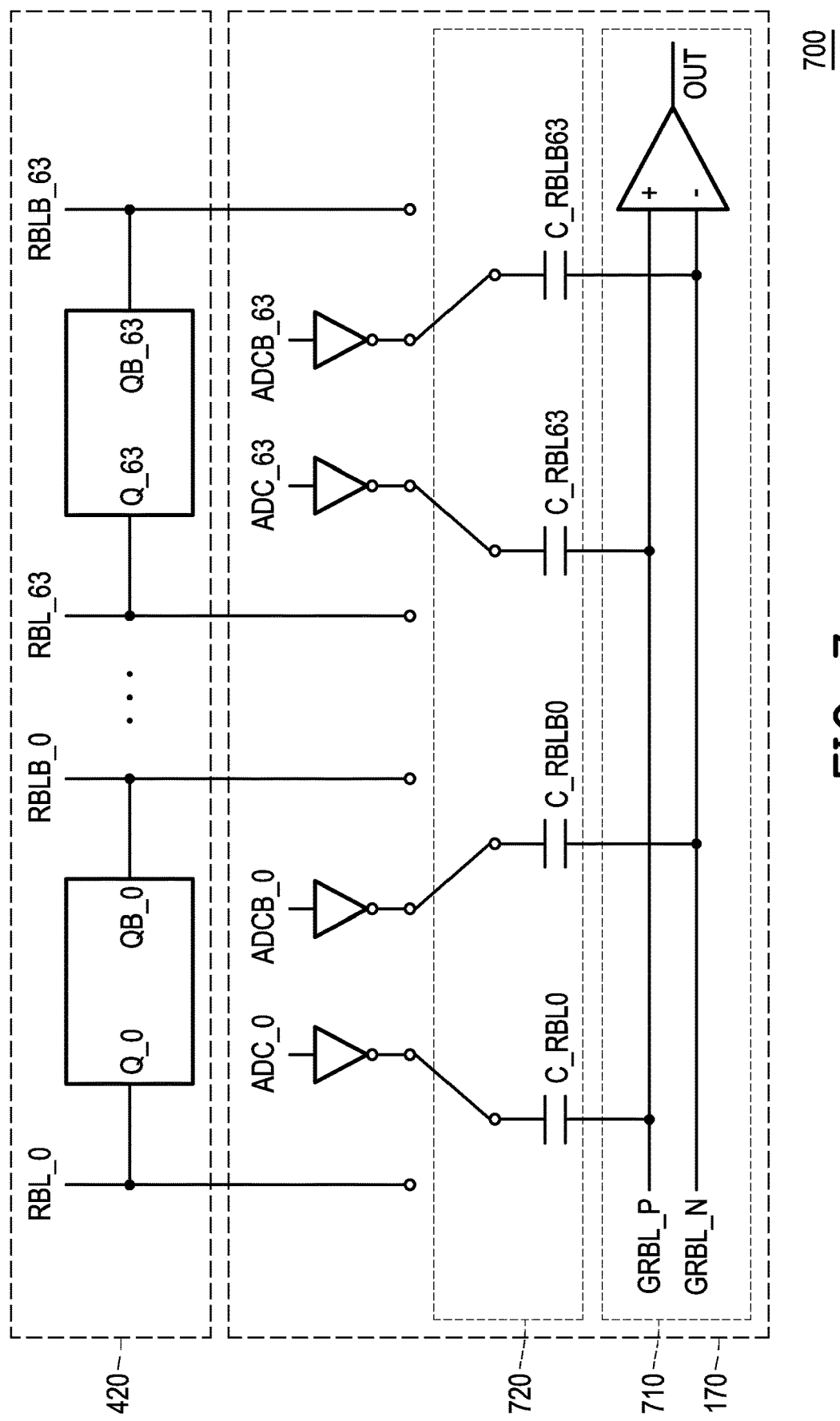
FIG. 7 is a circuit schematic diagram of a unified charge processing network (UCPN) according to an embodiment of the disclosure.

Referring to FIG. 7, FIG. 7 is a circuit schematic diagram of a unified charge processing network (UCPN) according to an embodiment of the disclosure.

In this embodiment, using the unified UCPN 170 not only provides signal processing, data transmission and conversion functions at the same time, but also improves the overall energy efficiency and area efficiency. Only a single capacitor array 720 is used on the multiple complementary bit lines RBL_0, RBLB_0, RBL_63, and RBLB_63. The capacitor array 720 includes multiple output capacitors C_RBL0, C_RBL63, C_RBLB, C_RBLB0, and C_RBLB63 for storing MAC results during data calculation. Under the architecture 720, the capacitor array 720 also serves as a switch capacitor of the ADC, so as to convert the computation result to generate digital information. Accordingly, the disclosure increases the area usage efficiency on the wafer by a factor of 1.15. In addition, the unified UCPN 170 also reduces the signal propagation path, and substantially effectively reduce the impact of the output voltage swing drop on the global read bit lines GRBL_P and GRBL_N due to the use of multiple output capacitors C_RBL0, C_RBLB0, C_RBL63, and C_RBLB63 to divide the voltage. At the same time, there is no need to use an additional bootstrap circuit to increase the voltage level sent to the comparator for comparison to improve data conversion accuracy, thereby reducing additional area consumption. In other words, under the architecture 710, the unified UCPN 170 includes a comparator whose output result OUT is converted into a 7-bit output through the SAR ADC. In particular, the unified UCPN 170 may effectively avoid the effect of reducing the output voltage swing caused by the charge redistribution of multiple output capacitors, and at the same time, because the capacitors are shared with the SAR ADC, the capacitor overhead on the chip may be saved.

In this embodiment, the unified UCPN 170 includes multiple switching pairs in series with the output capacitor pairs C_RBL0, C_RBLB0, C_RBL63, and C_RBLB63. The switching pairs receive analog-to-digital conversion control signals (ADC_0, ADCB_0) and (ADC_63, ADCB_63) with complementary logic voltage levels on the bit line pairs RBL_0, RBLB_0, RBL_63, and RBLB_63 through the corresponding inverters.

In one embodiment, the computing array 420 includes multiple bit lines RBL_0 and RBLB_0, and multiple word lines. The bit lines RBL_0, RBLB_0, RBL_63, and RBLB_63 include multiple bit line pairs whose logic voltage levels are complementary. The bit lines RBL_0, RBLB_0, RBL_63, and RBLB_63 are charged to a predetermined voltage by the DACs during the pre-charge period to accumulate charges for the output capacitor pairs C_RBL0, C_RBLB0, C_RBL63, and C_RBLB63, and the capacitor bottom-plates of the output capacitor pairs C_RBL0, C_RBLB0, C_RBL63, and C_RBLB63 are connected to the corresponding bit line pairs RBL_0, RBLB_0, RBL_63, and RBLB_63.

In one embodiment, after the pre-charge period ends, the word lines determine whether the external data executes the corresponding computation with the corresponding computing arrays based on the word line enable signal. In one embodiment, each of the DACs determines whether to input the external data into the corresponding computing array based on a digital-to-analog conversion enable signal, a bit line enable signal, and an inverted (complementary) bit line enable signal during the pre-charge period.

In one embodiment, the switching pair includes a first switch and a second switch. The first switch is switched within a predetermined time interval in response to the clock signal to connect the first bit line or the first inverter, in which the first inverter receives the first analog-to-digital conversion control signal. The second switch is switched within a predetermined time interval in response to the clock signal to connect the second bit line or the second inverter, in which the second inverter receives the second analog-to-digital conversion control signal. When the first bit line and the second bit line are in the executing computation stage, their corresponding logic voltage levels are complementary to each other.

In one embodiment, the output capacitor pair includes a first output capacitor and a second output capacitor. The first output capacitor electrically connects one end of the first output capacitor to the first bit line in a predetermined time interval based on the first switch, in which the first output capacitor is pre-charged to a first voltage level.

In one embodiment, the second output capacitor electrically connects one end of the second output capacitor to the second bit line in a predetermined time interval based on the second switch, in which the first output capacitor is pre-charged to a second voltage level. The other end of the first output capacitor and the other end of the second output capacitor are respectively electrically connected to a comparator. The comparator may be configured to compare the voltage difference between the first voltage level and the second voltage level.

In one embodiment, the charge processing network includes a first global read bit line and a second global read bit line. The first global read bit line is coupled to the other end of the first output capacitor and the positive end of the comparator. The second global read bit line is coupled to the other end of the second output capacitor and the negative end of the comparator. Before the pre-charge period, the first global read bit line and the second global read bit line are grounded, so that the voltage levels on the first global read bit line and the second global read bit line are zero.

In one embodiment, during the data transmission period, the first switch switches one end of the first output capacitor to the first inverter during data transmission in response to the clock signal, and the second switch switches one end of the second output capacitor to the second inverter during data transmission in response to the clock signal. The input data is accumulated on the first global read bit line and the second global read bit line.

In one embodiment, during the pre-charge period, the voltage difference between the first output capacitor and the second output capacitor is the voltage at which the DAC is pre-charged.

In one embodiment, each of the charge processing networks is electrically connected to multiple bit lines, in which the bit lines share an output capacitor capacitance array formed of multiple output capacitor pairs.

In one embodiment, the charge processing networks perform a bottom-plate sampling on the output capacitor capacitance array that is shared, and execute a charge redistribution process to output a corresponding output voltage value on a corresponding global read bit line.

In one embodiment, multiple charge processing networks may simultaneously store the results of multiplication and accumulation computations using the output capacitor capacitance array that is shared during computations executed by an SAR ADC.

In one embodiment, the output voltage value is based on a result of averaging the input data after accumulating operations. The output voltage value is computed by the SAR ADC, the output result is the input data multiplied by the corresponding weight units in the computing arrays and then averaged.

To sum up, the computing-in-memory circuitry according to the embodiments of the disclosure may be based on a computing-in-memory circuitry using static random access memory. The disclosure also provides a static random access memory of computing-in-memory (CIM SRAM) circuitry architecture with high throughput, high energy, and area efficiency applied to terminal AI devices.

By improving the data processing and conversion circuits, it may overcome the current limitations of CIM SRAM in circuit performance, and may improve the problem of power consumption of the circuit and the problem of limited operation linearity, thereby the operation speed, energy efficiency and linearity of the overall memory are improved. Besides, the disclosure also provides a UCPN, which provides both signal processing and data conversion functions to improve energy efficiency, and at the same time improve circuit performance and chip area efficiency during the physical design of the chip.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

The invention claimed is:

1. A computing-in-memory circuitry, comprising:
a plurality of digital-to-analog converters, at least one of the digital-to-analog converters converting external data to input data, each of the digital-to-analog converters connecting in series with a corresponding plurality of output capacitor pairs;
a plurality of computing arrays, at least one of the computing arrays receiving the input data from both ends and executing a computation to output a first computing value;
a plurality of charge processing networks, at least one of the plurality of charge processing networks receiving and accumulating the first computing value over a predetermined time interval through a plurality of switching pairs in series with the output capacitor pairs, wherein the charge processing networks evenly distribute charges of the first computing value to at least one of the selected output capacitor pairs, and compare a voltage difference between two ends of the at least one of the output capacitor pairs to output a second computing value.

2. The computing-in-memory circuitry according to claim 1, wherein the digital-to-analog converters comprise a dynamic binary-weighted current source array, and a plurality of logic voltage level complementary bit line pairs connected in series with the output capacitor pairs, wherein the input data is current-steering data.

3. The computing-in-memory circuitry according to claim 1, wherein each of the charge processing networks comprises the switching pairs in series with the output capacitor pairs, wherein the switching pairs receive analog-to-digital conversion control signals with complementary logic voltage levels through corresponding plurality of inverters.

4. The computing-in-memory circuitry according to claim 1, wherein the computing arrays comprise:
a plurality of bit lines, wherein the bit lines comprise a plurality of bit line pairs with complementary logic voltage levels, wherein the bit lines are charged to a predetermined voltage by the digital-to-analog converters during a pre-charging period to perform charge accumulation on the output capacitor pairs, and capacitor bottom-plates of the output capacitor pairs are connected to the respective bit line pairs; and
a plurality of word lines, after the pre-charge period, determining whether the external data executes corresponding computation with the corresponding computing arrays based on a word line enable signal.

5. The computing-in-memory circuitry according to claim 4, wherein the computing arrays further comprise:
a plurality of computing banks, wherein each of the computing banks comprises a plurality of computing units, each of the computing units comprises:
a plurality of weight units, wherein the weight units are connected in parallel with each other, and both ends of each of the weight units are respectively electrically connected to at least one of the corresponding bit line pairs, wherein the weight units store corresponding weights.

6. The computing-in-memory circuitry according to claim 5, wherein, when computation is executed with the corresponding weights of the weight units fixed, the computation is performed based on one of the selected weight units, and remaining unselected weight units maintain an idle state.

7. The computing-in-memory circuitry according to claim 5, wherein each of the plurality of computing banks further comprises:
a sign bit switch, the sign bit switch is electrically connected to the at least one of the corresponding bit line pairs, wherein the corresponding sign bit switch is determined based on a positive and negative value of the input data before the pre-charge period.

8. The computing-in-memory circuitry according to claim 5, wherein each of the computing units is a static random access memory formed of 10 transistors.

9. The computing-in-memory circuitry according to claim 1, wherein the output capacitor pairs have substantially same capacitance values.

10. The computing-in-memory circuitry according to claim 1, wherein, each of the plurality of digital-to-analog converters determines whether to input the external data to the corresponding computing array based on a digital-to-analog conversion enable signal, a first bit line enable signal, and a second bit line enable signal during a pre-charge period.

11. The computing-in-memory circuitry according to claim 1, wherein the switching pairs comprise:
a first switch, switched within the predetermined time interval in response to a clock signal to connect a first bit line or a first inverter, wherein the first inverter receives a first analog-to-digital conversion control signal; and a second switch, switched within the predetermined time interval in response to the clock signal to connect a second bit line or a second inverter, wherein the second inverter receives a second analog-to-digital conversion control signal, wherein when the first bit line and the second bit line are in an executing computation stage, corresponding logic voltage levels of the first bit line and the second bit line are complementary to each other.

12. The computing-in-memory circuitry according to claim 10, wherein each of the output capacitor pairs comprises:
a first output capacitor, electrically connecting one end of the first output capacitor to the first bit line in the predetermined time interval based on the first switch, wherein the first output capacitor is pre-charged to a first voltage level; and
a second output capacitor, electrically connecting one end of the second output capacitor to the second bit line in the predetermined time interval based on the second switch, wherein the second output capacitor is pre-charged to a second voltage level, wherein another end of the first output capacitor and another end of the second output capacitor are respectively electrically connected to a comparator to compare the voltage difference between the first voltage level and the second voltage level.

13. The computing-in-memory circuitry according to claim 11, wherein each of the charge processing networks comprises:
a first global read bit line, coupled to the another end of the first output capacitor and a positive end of the comparator; and
a second global read bit line, coupled to the another end of the second output capacitor and a negative end of the comparator, wherein before the pre-charge period, the first global read bit line and the second global read bit line are grounded, so that the voltage levels on the first global read bit line and the second global read bit line are zero.

14. The computing-in-memory circuitry according to claim 13, wherein during a data transmission period, the first switch switches the one end of the first output capacitor to the first inverter in response to the clock signal during the data transmission period, and the second switch switches the one end of the second output capacitor to the second inverter in response to the clock signal during the data transmission period, wherein the input data is accumulated on the first global read bit line and the second global read bit line.

15. The computing-in-memory circuitry according to claim 11, wherein, during the pre-charge period, a voltage difference between the first output capacitor and the second output capacitor is a voltage at which the digital-to-analog converter is pre-charged.

16. The computing-in-memory circuitry according to claim 1, wherein each of the charge processing networks is electrically connected to the bit lines, wherein the bit lines share an output capacitor capacitance array formed by the output capacitor pairs.

17. The computing-in-memory circuitry according to claim 16, wherein the charge processing networks perform a bottom-plate sampling on the output capacitor capacitance array that is shared, and execute a charge redistribution process to output a corresponding output voltage value on a corresponding global read bit line.

18. The computing-in-memory circuitry according to claim 17, the plurality of charge processing networks simultaneously store results of multiplication and accumulation computations using the output capacitor capacitance array that is shared during computations executed by a successive-approximation analog-to-digital converter.

19. The computing-in-memory circuitry according to claim 17, wherein the output voltage value is based on a result of averaging the input data after accumulating operations, wherein the output voltage value is computed by a successive-approximation analog-to-digital converter, an output result is the input data multiplied by corresponding weight units in the computing arrays and then averaged.

20. The computing-in-memory circuitry according to claim 1, further comprising:
a decoding circuit, receiving an input enable signal to decode the external data that is encoded to obtain a decoded corresponding address;
a driving circuit, driving at least one of the computing arrays corresponding to the address through a plurality of word lines, and electrically connecting to a digital-to-analog converter through the word lines; and
an input output circuit, wherein the input output circuit transmits the external data to at least one of the digital-to-analog converters through a plurality of bit lines.

* * * * *